(12) United States Patent
Zhang et al.

(10) Patent No.: US 8,373,981 B2
(45) Date of Patent: Feb. 12, 2013

(54) EXPANSION CARD FASTENING DEVICE

(75) Inventors: Jun-Xiong Zhang, Shenzhen (CN); Zhi-Xin Li, Shenzhen (CN); You-Tao Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 288 days.

(21) Appl. No.: 12/875,093

(22) Filed: Sep. 2, 2010

(65) Prior Publication Data

US 2011/0286182 A1 Nov. 24, 2011

(30) Foreign Application Priority Data

May 20, 2010 (CN) .......................... 2010 1 0178774

(51) Int. Cl.
   G06F 1/16 (2006.01)
   H05K 1/14 (2006.01)
   H05K 7/18 (2006.01)
   H05K 7/02 (2006.01)
   H01R 13/62 (2006.01)
   H01R 13/64 (2006.01)

(52) U.S. Cl. .............. 361/679.32; 361/679.31; 361/737; 361/801; 361/802; 361/807; 361/810; 439/327; 439/328; 439/372; 439/377

(58) Field of Classification Search .......... 361/679.31, 361/679.32, 737, 740, 741, 747, 759, 801–803, 361/752, 753, 807, 810; 439/327, 328, 372, 439/377; 211/41.17
See application file for complete search history.

(56) References Cited

U.S. PATENT DOCUMENTS

| | | | | |
|---|---|---|---|---|
| 5,914,854 A | * | 6/1999 | Holt | 361/679.23 |
| 6,181,565 B1 | * | 1/2001 | Schmitt et al. | 361/756 |
| 6,618,264 B2 | * | 9/2003 | Megason et al. | 361/759 |
| 6,735,091 B2 | * | 5/2004 | Megason et al. | 361/801 |
| 6,834,766 B2 | * | 12/2004 | Lin et al. | 211/41.17 |
| 6,856,518 B2 | * | 2/2005 | Dobbs et al. | 361/801 |
| 7,050,296 B2 | * | 5/2006 | Liao | 361/679.33 |
| 7,864,518 B2 | * | 1/2011 | Wu et al. | 361/679.32 |
| 2004/0174687 A1 | * | 9/2004 | Wang et al. | 361/801 |
| 2007/0242442 A1 | * | 10/2007 | Dai | 361/801 |

* cited by examiner

*Primary Examiner* — Zachary M Pape
*Assistant Examiner* — Nidhi Desai
(74) *Attorney, Agent, or Firm* — Altis Law Group, Inc.

(57) ABSTRACT

An expansion card fastening device includes a bracket, a first fastener, and a second fastener. The bracket includes parallel arranged fences. The first fastener is assembled on one of the fences, and includes a connecting portion, a supporting portion, and an elastic element. The supporting portion and the elastic element are both disposed on an end of the connection portion. A first clasp protrudes from the supporting portion, and faces the same direction with a free end of the elastic element. A second fastener pivots to the supporting portion, and is resisted by the elastic element. A second clasp protrudes from the second fastener, and faces the same direction with the first clasp.

11 Claims, 6 Drawing Sheets

EXPANSION CARD FASTENING DEVICE

BACKGROUND

1. Technical Field

The present disclosure relates to fastening devices, and more especially, to an expansion card fastening device used in computer systems.

2. Description of Related Art

As computer functions increase, more expansion cards are equipped with the computer. Generally, expansion cards are fixed in a computer case by fastening devices. However, different expansion cards vary in sizes. Therefore, it requires different fastening devices to lock those different expansion cards in place. It is inconvenient for users to replace the expansion cards having different sizes.

Therefore it is desirable to provide an expansion card fastening device suitable for fastening different sized expansion cards.

DETAILED DESCRIPTION

Figure 1:
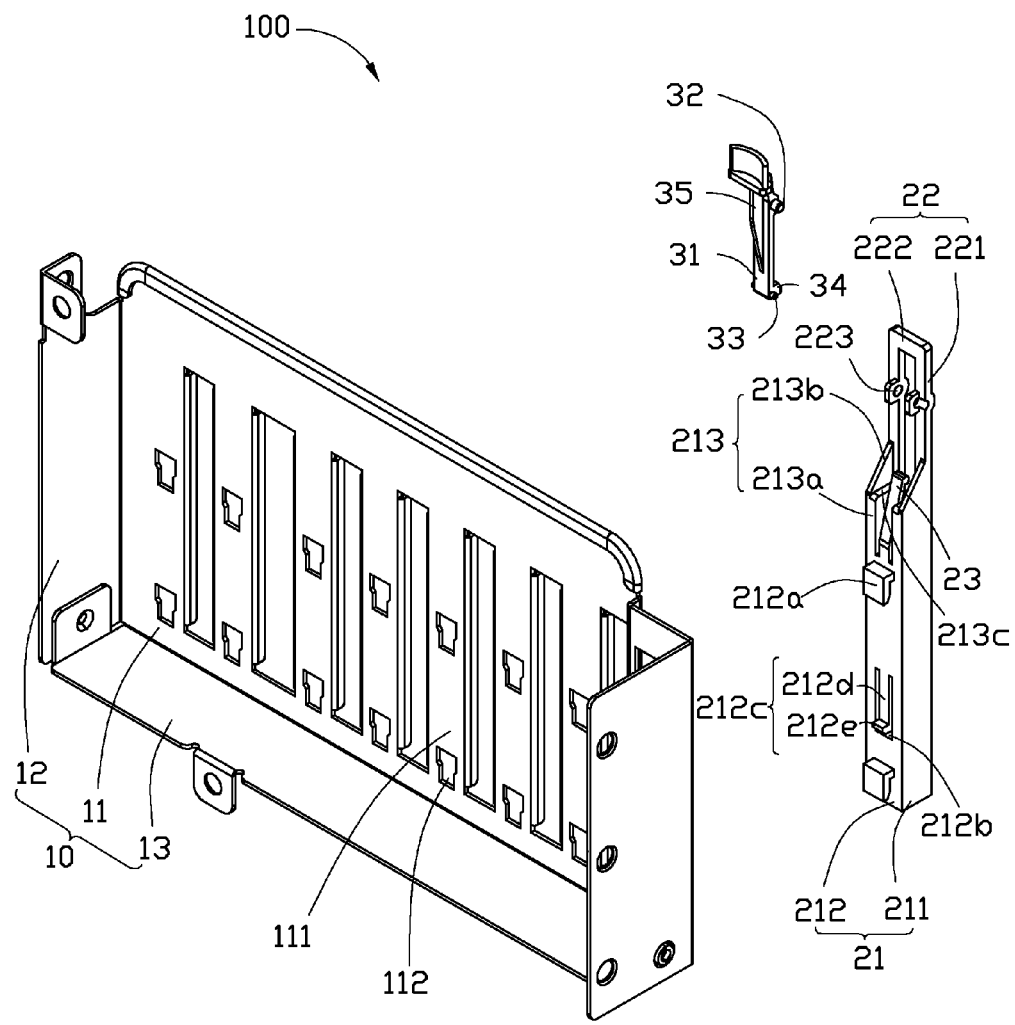
FIG. 1 is an isometric, exploded view of an expansion card fastening device in accordance with an exemplary embodiment.
Figure 2:
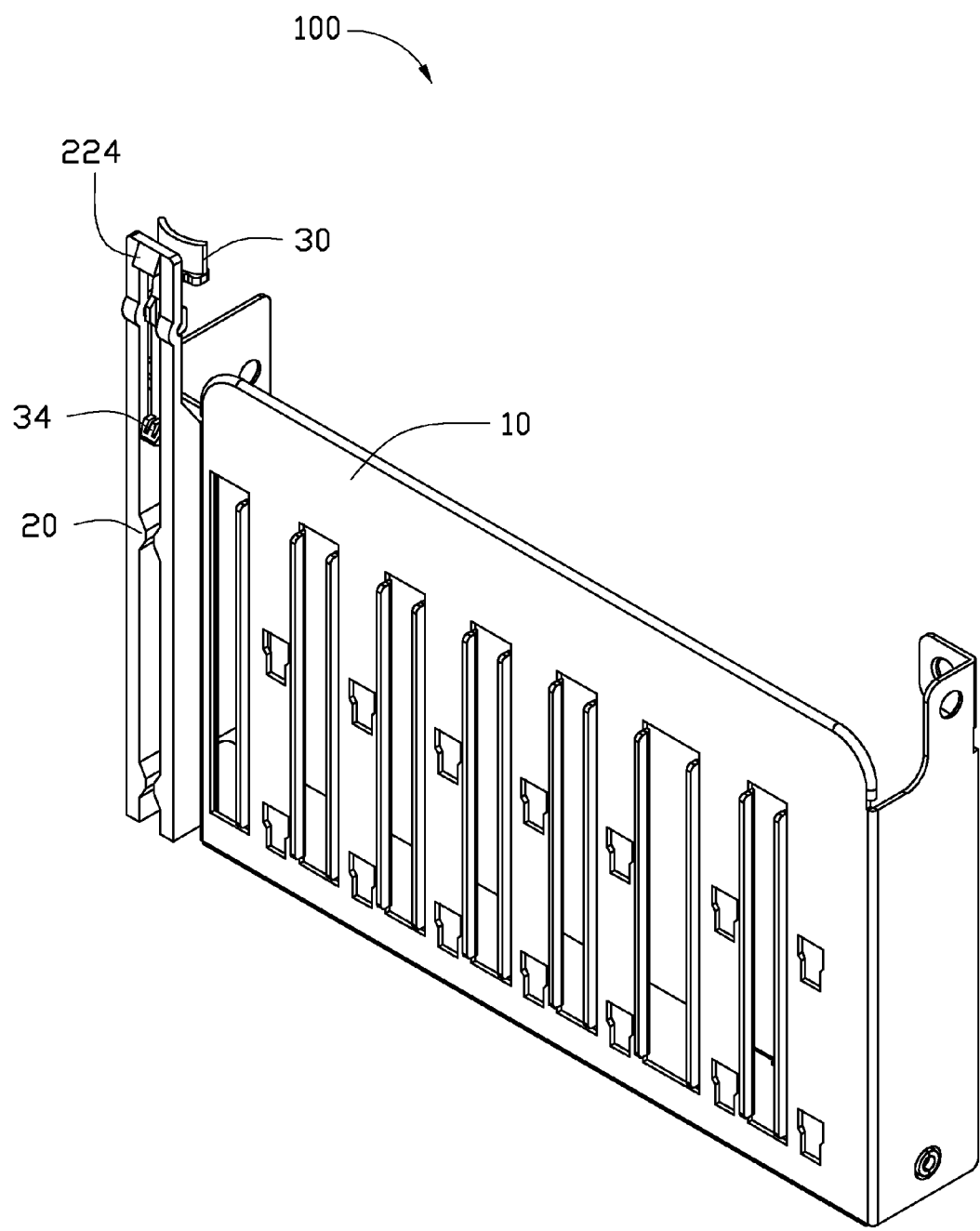
FIG. 2 is an isometric assembled view of the expansion card fastening device of FIG. 1.

Referring to FIGS. 1 and 2, an expansion card fastening device 100 in accordance with an exemplary embodiment is shown. The fastening device 100 comprises a bracket 10, a first fastener 20, and a second fastener 30. The first fastener 20 is assembled on the bracket 10 for fastening a first expansion card (referring to FIG. 3). The second fastener 30 pivots to the first fastener 20 for fastening a second expansion card (referring to FIG. 5) which is lower than the first expansion card.

The bracket 10 includes a fixing plate 11 having a number of parallel slots (not labeled) defined thereon, a pair of side plates 12 perpendicularly extending from two opposite sides of the fixing plate 11, and a bottom plate 13 perpendicularly extending from another side of the fixing plate 11 and interconnects the side plates 12. The fixing plate 11 comprises a number of parallel arranged fences 111, each of which defines at least two access ports 112 thereon.

The first fastener 20 comprises a connecting portion 21, a supporting portion 22, and an elastic element 23. The supporting portion 22 and the elastic element 23 are both disposed on an end of the connection portion 21.

The connection portion 21 comprises two side walls 211 and a rear wall 212 interconnected with the side walls 211. Two hooks 212a extend out from an outer surface of the rear wall 212, corresponding to the access ports 112 of the fixing plate 11. A recess 212b is defined in the middle of the rear wall 212 between the hooks 212a. An elastic piece 212c extends out from a sidewall of the recess 212b. The elastic piece 212c comprises an extending arm 212d and an extending tab 212e. The extending arm 212d is received in the recess 212b and extends out from the sidewall of the recess 212b along a parallel direction of the connection portion 21. The extending tab 212e is perpendicularly positioned on a distal end of the extending arm 212d and protrudes out from the outer surface of the rear wall 212. Each of the side walls 211 extends out a wing plate 213. The wing plate 213 comprises a connecting plate 213a connected to the corresponding side wall 211 and a reinforce plate 213b connected to the connecting plate 213a. The thickness of the reinforce plate 213b is thinner than that of the connecting plate 213a. A limiting step 213c is formed at the joint of the reinforce plate 213b and the connecting plate 213a.

The supporting portion 22 comprises two parallel supporting poles 221 respectively extending from the corresponding connecting plates 213a as well as connected to the reinforce plate 213b, and a bridge beam 222 interconnecting the two supporting poles 221. A shaft seat 223 is formed on one side of the supporting pole 221 and extends in a direction toward the rear wall 212. A first clasp 224 perpendicularly protrudes from the bridge beam 222 opposite to the shaft seats 223.

The elastic element 23 is accommodated between the connecting plates 213a and angularly connected to an end of the rear wall 212, forming an inclined free end thereof adjacent to the supporting poles 221.

The second fastener 30 comprises a main body 31, two pivots 32 extending out from two opposite sides of the main body 31, and two guiding rods 33 extending out from the opposite sides of the main body 31 apart from the two pivots 32. A second clasp 34 protrudes from the other side of the main body 31 adjacent to the guiding rods 33. The second fastener 30 is reinforced by a supplemental plate 35 perpendicularly formed on a side of the second fastener 30 opposite to the second clasp 34.

In assembly, the pivots 32 of the second fastener 30 pivot in the corresponding shaft seats 223, and the guiding rods 33 resist against the limiting steps 213c. The free end of the elastic element 23 is resisted against the supplemental plate 35. The second clasp 34 is positioned between the supporting poles 221, while the first clasp 224 and the second clasp 34 face the same direction. The first fastener 20 and the second fastener 30 are assembled into the bracket 10, where the hooks 212a of the first fastener 20 are clasped on the access ports 112 of the fences 111, and the extending tab 212e of the elastic piece 212c resists against the corresponding fence 111.

Figure 3:
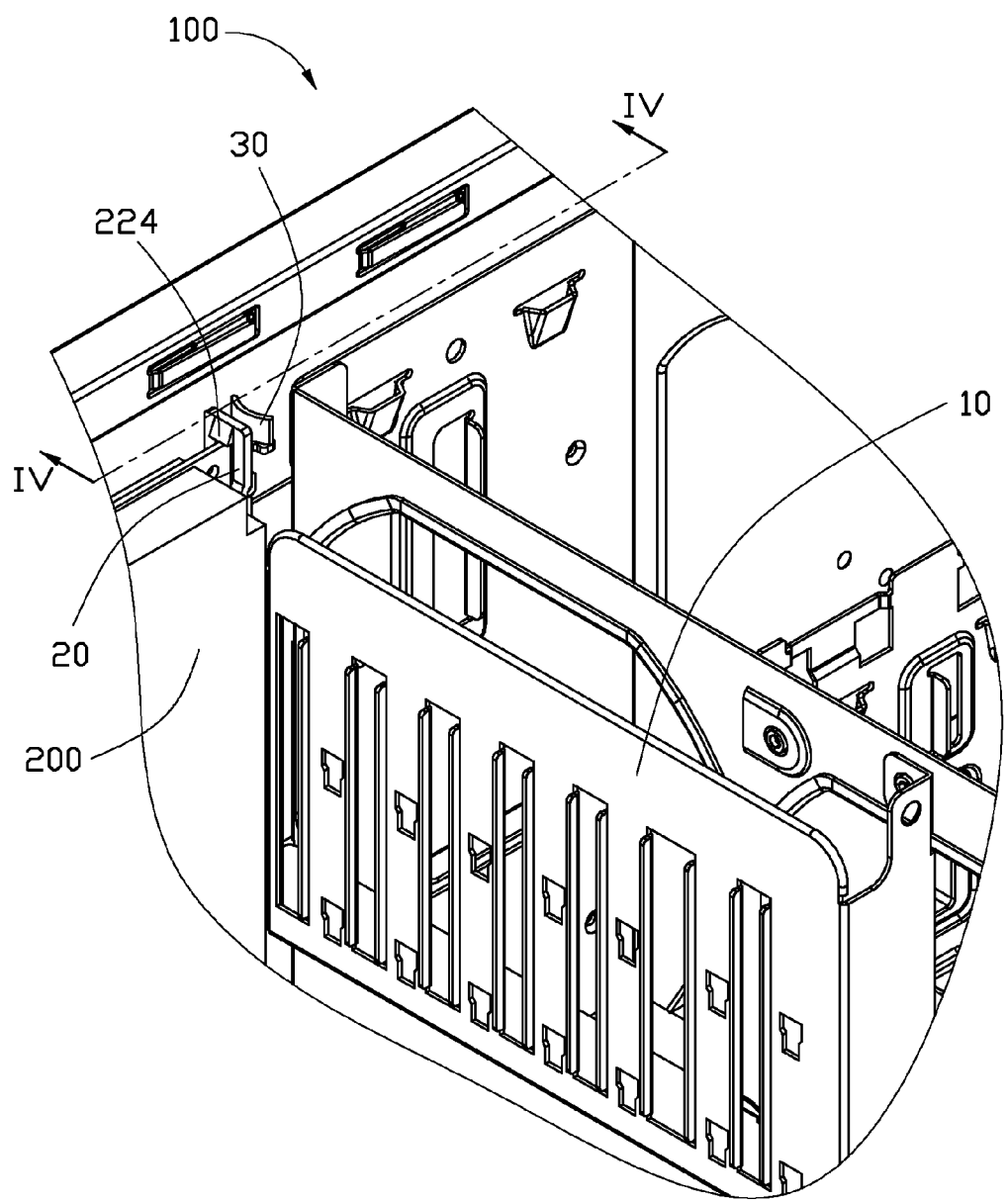
FIG. 3 is an isometric view of the expansion card fastening device of FIG. 1, shown fastening a first expansion card.
Figure 4:
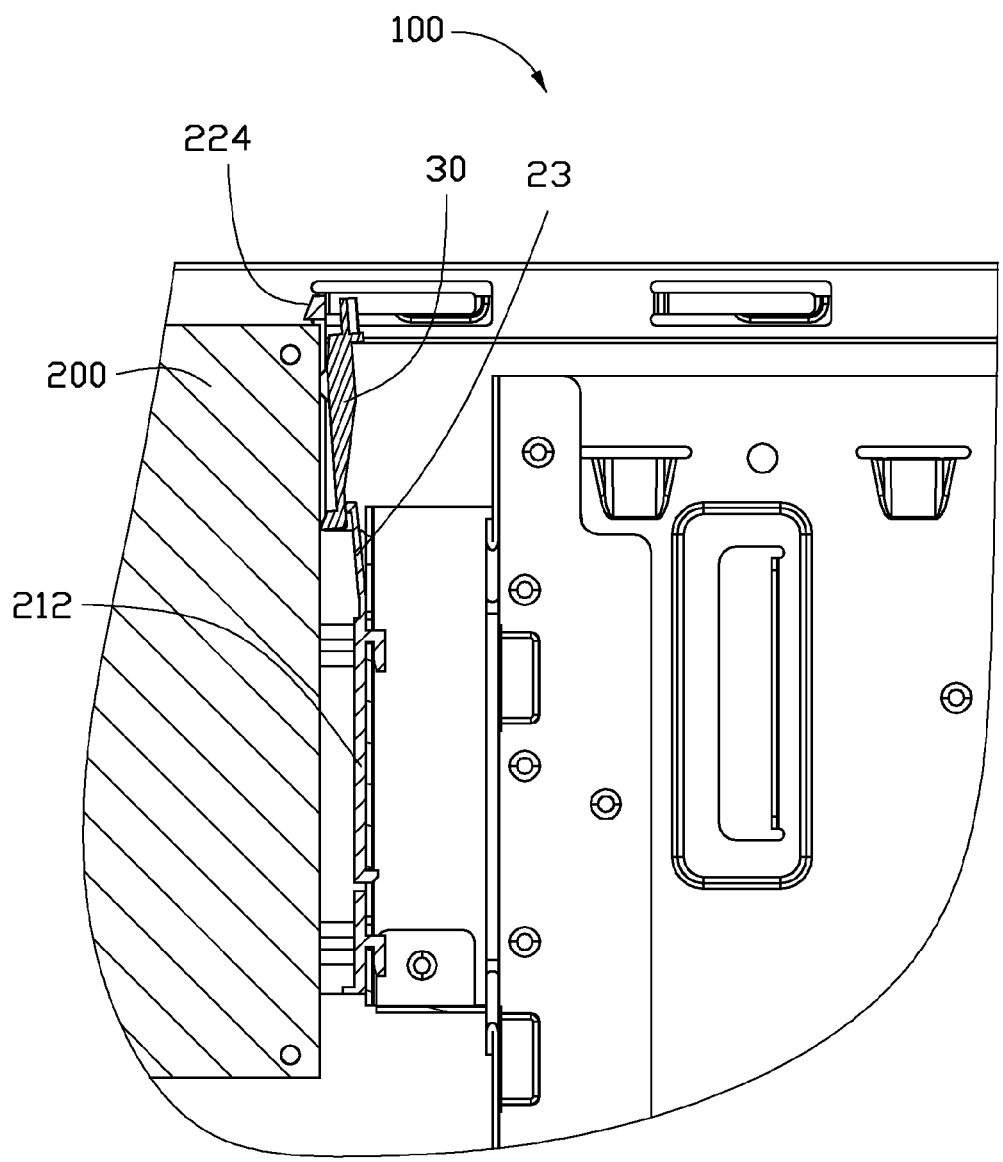
FIG. 4 is a partial cross sectional view of the expansion card fastening device, taken along line IV-IV of FIG. 3.

Referring to FIGS. 3 to 4, the first expansion card 200, with a first height mated to the height of the first clasp 224, is plugged into the fastening device 100 along the extending direction of the first fastener 20. The first clasp 224 resiliently flexes from its original position under the pressure of the first expansion card 200, until the top side of the first expansion card 200 locates under the first clasp 224; and the bottom side of the first expansion card 200 is stopped by the expansion slots (not shown). Then the first clasp 224 returns to its original position, and the top side of the first expansion card 200 is fixed by the first clasp 224.

Figure 5:
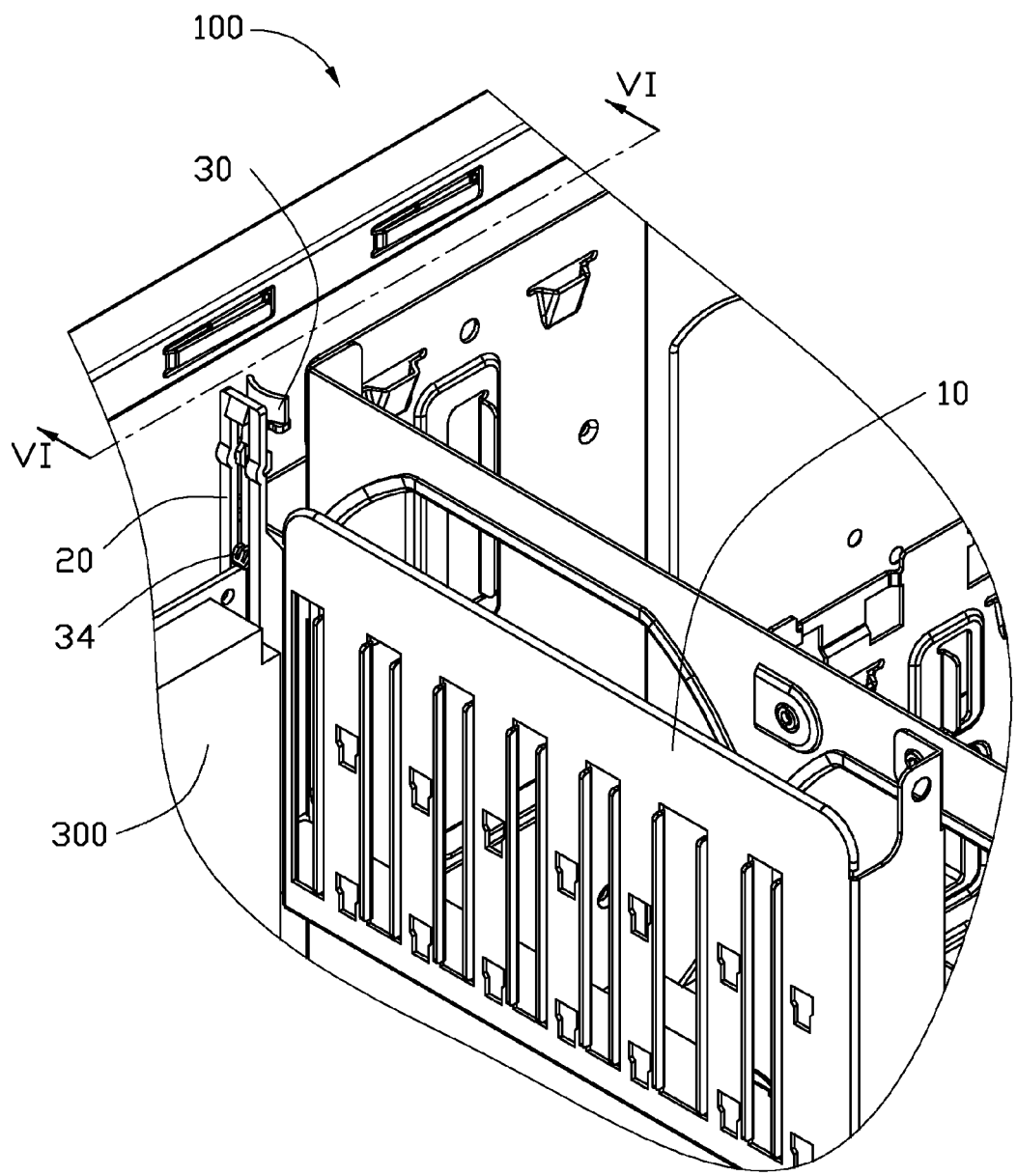
FIG. 5 is an isometric view of the expansion card fastening device of FIG. 1, shown fastening a second expansion card different from the first expansion card in height.
Figure 6:
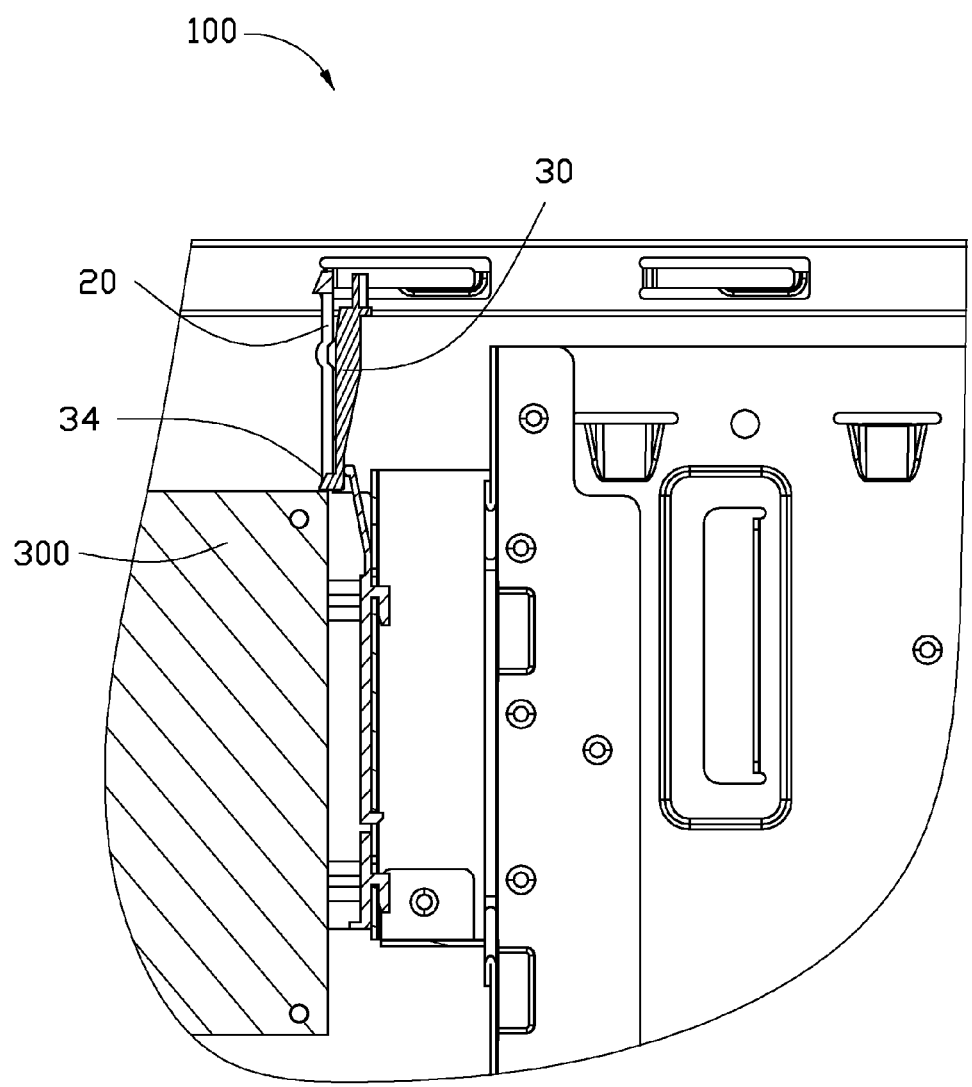
FIG. 6 is a partial cross sectional view of the expansion card fastening device, taken along line VI-VI of FIG. 5.

Referring to FIGS. 5 to 6, the second expansion card 300 which is lower than the first expansion card 200, with a second height mated to the height of the second clasp 34, is plugged into the fastening device 100 along the extending direction of the first fastener 20. The second fastener 30 is compressed to rotate about the pivots 32, and the elastic element 23 is resiliently flexed from its original position under the pressure of the second fastener 30, until the top side of the second expansion card 300 locates under the second clasp 34 and the bottom side of the second expansion card 300 is stopped by expansion slots (not shown). Then the second fastener 30 is compressed by the elastic element 23 to its original position, and the top side of the second expansion card 300 is fixed by the second clasp 34.

The present disclosure provides two clasps positioned at different heights thereby obtaining the ability of fastening different sized expansion cards, so as to facilitate the replacement/exchange of the expansion cards.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An expansion card fastening device, comprising: a bracket comprising a plurality of parallel arranged fences; a first fastener assembled on one of the fences, and comprising a connecting portion, a supporting portion, and an elastic element, wherein the supporting portion and the elastic element are positioned on an end of the connection portion; a first clasp protrudes from the supporting portion and faces the same direction with a free end of the elastic element; and a second fastener pivoting to the supporting portion, and resisted by the elastic element, wherein a second clasp protrudes from the second fastener and faces the same direction with the first clasp; wherein each of the fences defines two access ports thereon; the connecting portion comprises two side walls and rear wall interconnected with the side walls; two hooks extend out from an outer surface of the rear wall and are clasped in the access ports; and wherein each of the side walls extends out a wing plate; the wing plate comprises a connecting plate connected to the side wall and a reinforce plate connected to the connecting plate; the reinforce plate is thinner than the connecting plate, whereby a limiting step is formed at the joint of the reinforce plate and the connecting plate; the elastic element is accommodated between the connecting plates.

2. The expansion card fastening device of claim 1, wherein a recess is defined on the rear wall between the hooks; an elastic piece extends out from a sidewall of the recess; the elastic piece comprises an extending arm and an extending tab positioned on a distal end of the extending arm; the extending tab resists against the fence.

3. The expansion card fastening device of claim 1, wherein the supporting portion comprises two parallel supporting poles and a bridge beam; the supporting poles extend from the connecting plates and are connected to the reinforce plate; the bridge beam interconnects the supporting poles; a shaft seat is positioned on one side of each supporting pole and extends in a direction toward the rear wall; the second fastener pivots in the shaft seats.

4. The expansion card fastening device of claim 3, wherein the second fastener comprises a main body, two pivots symmetrically extending out from two opposite sides of the main body, and two guiding rods symmetrically extending out from the opposite sides of the main body apart from the two pivots; the two pivots pivot in the shaft seat; the guiding rods resist against the limiting step.

5. The expansion card fastening device of claim 4, wherein the second fastener comprises a supplemental plate; the supplemental plate is perpendicularly positioned on a side of the second fastener opposite to the second clasp.

6. The expansion card fastening device of claim 3, wherein the elastic element obliquely extends from an end of the rear wall; the free end of the elastic element is adjacent to the supporting poles.

7. An expansion card fastening device, comprising: a bracket comprising a fence; a first fastener comprising a connecting portion, a supporting portion, and an elastic element, wherein the connecting portion is positioned on the fence; the supporting portion and the elastic element are positioned on an end of the connection portion; a first clasp extends from the supporting portion; the elastic element obliquely extends from the end of the connection portion; a free end of the elastic element is adjacent to the supporting portion; and a second fastener rotatably connected to the supporting portion, wherein a second clasp extends from the second fastener; the first and second clasps face the same direction; the elastic element resists against the second fastener; wherein the connecting portion comprises two side walls and a rear wall interconnected with the side walls; each of the side walls extends out a wing plate; the elastic element is accommodated between the wing plates of the two side walls; and wherein each of the wing plates comprises a connecting plate connected to the side wall and a reinforce plate connected to the connecting plate; the reinforce plate is thinner than the connecting plate, whereby a limiting step is formed at the joint of the reinforce plate and the connecting plate, and the elastic element is accommodated between the connecting plates of the wing plates.

8. The expansion card fastening device of claim 7, wherein the supporting portion comprises two parallel supporting poles and a bridge beam; the supporting poles extend from the connecting plates and are connected to the reinforce plate; the bridge beam interconnects the supporting poles; a shaft seat is positioned on one side of each supporting pole and extends in a direction toward the rear wall; the second fastener pivots in the shaft seats.

9. The expansion card fastening device of claim 8, wherein the second fastener comprises a main body, two pivots symmetrically extending out from two opposite sides of the main body, and two guiding rods symmetrically extending out from the opposite sides of the main body apart from the two pivots; the two pivots pivot in the shaft seat; the guiding rods resist against the limiting step.

10. The expansion card fastening device of claim 9, wherein the second fastener comprises a supplemental plate; the supplemental plate is perpendicularly positioned on a side of the second fastener opposite to the second clasp.

11. The expansion card fastening device of claim 8, wherein the elastic element obliquely extends from an end of the rear wall; the free end of the elastic element is adjacent to the supporting poles.

* * * * *